(12) United States Patent
Takamatsu et al.

(10) Patent No.: US 8,440,911 B2
(45) Date of Patent: May 14, 2013

(54) FLAT CABLE

(75) Inventors: Hiroshi Takamatsu, Tochigi (JP); Takeo Kimura, Tochigi (JP)

(73) Assignee: Dexerials Corporation, Tokyo (JP)

( * ) Notice: Subject to any disclaimer, the term of this patent is extended or adjusted under 35 U.S.C. 154(b) by 233 days.

(21) Appl. No.: 12/863,379

(22) PCT Filed: Jan. 13, 2009

(86) PCT No.: PCT/JP2009/050269
§ 371 (c)(1),
(2), (4) Date: Jan. 6, 2011

(87) PCT Pub. No.: WO2009/090927
PCT Pub. Date: Jul. 23, 2009

(65) Prior Publication Data
US 2011/0100673 A1    May 5, 2011

(30) Foreign Application Priority Data

Jan. 17, 2008  (JP) .................... 2008-007948

(51) Int. Cl.
*H01B 7/08* (2006.01)
(52) U.S. Cl.
USPC ..................................... 174/117 F
(58) Field of Classification Search ........... 174/36, 174/117 F, 117 FF
See application file for complete search history.

(56) References Cited

U.S. PATENT DOCUMENTS

| 2,877,286 | A | * | 3/1959 | Vance et al. | ............... | 174/391 |
| 5,658,164 | A | * | 8/1997 | Parker | ............... | 439/495 |
| 6,768,654 | B2 | * | 7/2004 | Arnold et al. | ............... | 361/818 |
| 7,737,362 | B2 | * | 6/2010 | Ogura | ............... | 174/102 R |
| 8,138,421 | B2 | * | 3/2012 | Takamatsu et al. | ............... | 174/117 F |

FOREIGN PATENT DOCUMENTS

| JP | S60-254583 | 12/1985 |
| JP | H01-95014 | 6/1989 |
| JP | H02-59521 | 5/1990 |
| JP | H06-60023 | 8/1994 |
| JP | 08-106818 | 4/1996 |
| JP | 10-145080 | 5/1998 |
| JP | 2003-229695 | 8/2003 |
| JP | 2004-031141 | 1/2004 |
| JP | 2005-093367 | 4/2005 |
| JP | 2005-109160 | 4/2005 |
| JP | 2005-339833 | 12/2005 |
| JP | 2006-286318 | 10/2006 |
| JP | 2007-305536 | 11/2007 |

OTHER PUBLICATIONS

International Search Report dated Apr. 20, 2009, for corresponding Patent Application No. PCT/JP2009/050269.

* cited by examiner

*Primary Examiner* — Chau Nguyen
(74) *Attorney, Agent, or Firm* — K&L Gates LLP (57) ABSTRACT

A flexible flat cable having good flexibility and bending resistance without deterioration of a good electrical characteristic of a strip structure and capable of enhancing cost effectiveness is provided. The flexible flat cable includes: a first shield member and a second shield member disposed in such a manner as to cover a surface of a cable body including a plurality of conductors arranged in parallel with a prescribed pitch therebetween. Each of the first and second shield members includes a metal member formed by placing a conductive adhesive layer placed between a plurality of metal layers, and allows one of outer most layers of the metal layers to be conductively connected with a ground layer.

11 Claims, 8 Drawing Sheets

FLAT CABLE

CROSS REFERENCE TO RELATED APPLICATIONS

The present application is a National Stage of International Application No. PCT/JP2009/050269 filed on Jan. 13, 2009 and which claims priority to Japanese Patent Application No. 2008-007948 filed on Jan. 17, 2008, the entire contents of which are being incorporated herein by reference.

BACKGROUND

The present application relates to a flat cable serving as an interconnecting cable for various components disposed inside various electronic devices.

Related art electronic devices such as a personal computer, a flat-screen television set, a printer, and a scanner often employ a flat cable serving as an interconnecting cable for various components to be disposed thereinside. A flexible printed circuit board type of the flat cable is produced by an etching method. However, such a type of the flat cable is costly, and a length thereof cannot be greater than 1,000 mm due to a manufacturing infrastructure, causing difficulty in being applied to the increasing size of the flat-screen television set.

A flexible flat cable produced by a laminating method, on the other hand, has attracted attention as a substitute for the flexible printed circuit board type of the flat cable. The flexible flat cable has good flexibility and can be used in a pivotable portion. Moreover, the production cost and the unit price of the flexible flat cable are lower than those of the flexible printed circuit board type. Accordingly, the flexible flat cable tends to be applied to a wide variety of fields.

Figure 11:
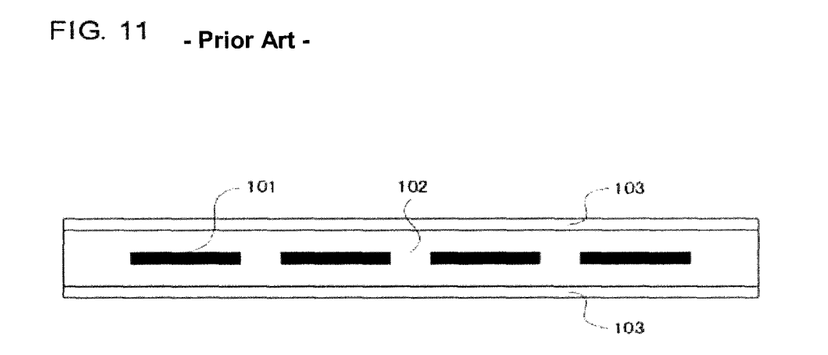
FIG. 11 is a cross-sectional view illustrating a related-art flexible flat cable.

Conventionally, the flexible flat cable is not demanded to have an electrical characteristic such as the characteristic impedance. For example, a related-art flexible flat cable is provided by sandwiching a central conductor 101 from both sides by base films 103 and laminating the base films 103 including a prescribed adhesion layer 102 applied thereto, so that both sides of the base films 103 are adhered as illustrated in FIG. 11, and the related-art flexible flat cable is supposed to satisfy specifications needed. Herein, the base film 103 is, for example, made of polyethylene terephthalate.

A flat cable of recent years, on the other hand, is demanded to increase the signal transmission speed with the development of various electronic devices including a flat-screen television set having a high definition image quality. The increase in the signal transmission speed is also technically needed for other electronic devices with the advancement of digitization. Accordingly, the importance of a signal integrity solution to the characteristic impedance, a permeation loss, an eye pattern aperture ratio, electromagnetic interference (hereafter referred to as EMI), and the like is rapidly increased for the signal transmission.

Such an increase in the signal transmission speed needs the control of the characteristic impedance. For example, an impedance control cable, in which the characteristic impedance is controlled, has been supplied to the market in recent years. The impedance control cable is expected not only to have enhanced capabilities thereof, but also to be produced at a low price.

Figure 12:
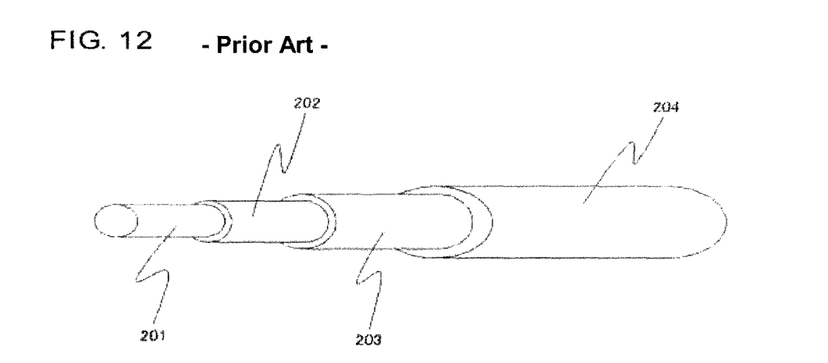
FIG. 12 is a schematic diagram illustrating a coaxial cable.

Herein, a coaxial cable, serving as the impedance control cable, is formed as illustrated in FIG. 12. For example, the coaxial cable is formed of: a dielectric substance 202 covering a periphery of a central conductor 201; an outer conductor 203 covering a periphery of the dielectric substance 202; and a prescribed outer sheath 204 covering an outermost layer thereof in an insulating manner. The coaxial cable is considered to be a high-end model in terms of a high frequency characteristic, and is expensive. Moreover, since the coaxial cable is used by arranging and soldering a plurality of coaxial lines on a connector, a length thereof tends to vary, causing a propagation delay of a signal. However, the variation in the cable length cannot be reduced easily in manufacturing, and inspection of every product becomes necessary. Such inspection causes an increase in the manufacturing costs. Accordingly, a flat type of the impedance control cable has attracted attention in recent years as an alternative to the coaxial cable from a cost standpoint.

Figure 13:
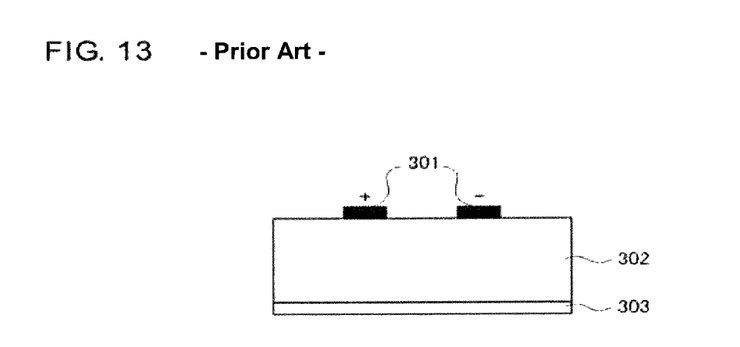
FIG. 13 is a cross-sectional view illustrating a flexible flat cable of a microstrip structure.
Figure 14:
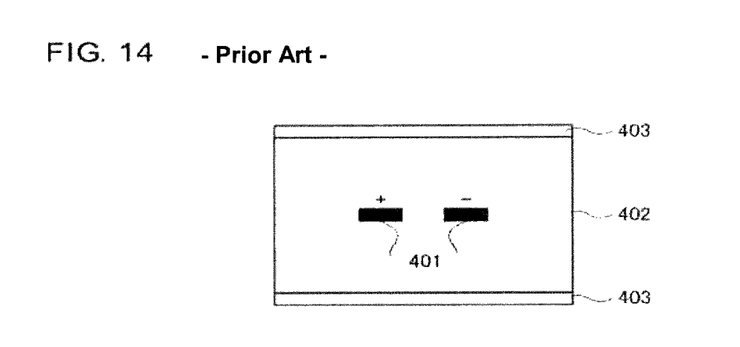
FIG. 14 is a cross-sectional view illustrating a flexible flat cable of a strip structure.

The flat type of the impedance control cable of a microstrip structure is illustrated in FIG. 13, and another flat type of the impedance control cable of a strip structure is illustrated in FIG. 14. In the impedance control cable of the microstrip structure, for example, a ground 303 is positioned on one surface of a transmission path formed of a conductor 301 and a dielectric substance 302 as illustrated in FIG. 13. In the impedance control cable of the strip structure, for example, grounds 403 are positioned on both respective surfaces of the transmission path formed of a conductor 401 and a dielectric substance 402 as illustrated in FIG. 14. The impedance control cables of the microstrip structure and the strip structure are already introduced in a market. Particularly, the impedance control cable of the microstrip structure is already employed in a certain flat-screen television set.

In the flat type of the impedance control cable, a noise source is contained by a shield layer made of metal to solve a problem of the electromagnetic interference described above, so that a leakage of the noise is reduced. Patent Documents 1 through 7 disclose and propose a shield member formed by adhesion of a metal foil to an outer sheath through a conductive adhesive agent as a technology relating to the flat type of the impedance control cable having the shield layer. Patent Document 8 discloses a shield cable formed by: folding a shield tape including a metal foil adhered to one surface side of a thermal flexible insulation sheet into two in such a manner that the metal foil is provided outward; and winding the two folded shield tape around an outer circumference of the cable.

Patent Document 1: Japanese Unexamined Patent Application Publication No. 2006-286318
Patent Document 2: Japanese Unexamined Patent Application Publication No. 2005-339833
Patent Document 3: Japanese Unexamined Patent Application Publication No. 2005-109160
Patent Document 4: Japanese Unexamined Patent Application Publication No. 2005-93367
Patent Document 5: Japanese Unexamined Patent Application Publication No. 2004-31141
Patent Document 6: Japanese Unexamined Patent Application Publication No. 2003-229695
Patent Document 7: Japanese Unexamined Patent Application Publication No. H10-145080
Patent Document 8: Japanese Unexamined Patent Application Publication No. S60-254583

SUMMARY

The flexible flat cable of the microstrip structure including the ground 303 disposed on one surface of the transmission path is not expected to suppress the radiation with respect to a surface opposite to a surface on which the ground 303 is disposed. Accordingly, the flexible flat cable of the microstrip structure has a problem of controlling the radiation, causing a decrease in the likelihood of being employed in mounting on a product.

The flexible flat cable of the strip structure, on the other hand, includes the grounds 403 disposed on both respective surfaces of the transmission path. The grounds 403 function as the shield layers, so that the flexible flat cable of the strip structure can be appropriate for the radiation suppression. However, since the disposition of the grounds 403 as outer conductors on the both surfaces causes an increase in a thickness of the cable, a vapor-deposited metal layer having a thickness of below 1 μm is often employed. Although such a flexible flat cable of the strip structure can control the characteristic impedance, the flexible flat cable of the strip structure has a difficulty in suppressing the permeation characteristic deterioration caused by the thinness of the vapor-deposited metal layer. Accordingly, a metal foil serving as the outer conductor is employed as a substitute for the vapor-deposited metal layer in the flexible flat cable of the strip structure, so that the permeation characteristics are improved. The flexible flat cable of the strip structure, however, needs to have the outer conductor having a thickness of several μm in consideration of the influence of conductor losses, and such a thickness may cause deterioration of flexibility or bending resistance. A thickness of the cable has tended to increase in recent years to meet a demand for the electrical characteristics while the flexibility or bending resistance of the cable has tended to deteriorate in recent years, causing a practical matter in which the wiring of the cable cannot be performed flexibly in a mounted electronic device.

The embodiments are proposed in consideration of the aforementioned conventional situations and provide a flat cable capable of not only having good flexibility and a good bending resistance but also enhancing cost effectiveness without deteriorating a good electrical characteristic provided by a strip structure.

In an embodiment, a metal layer of a shield member using a pliable material having conductivity to enhance the flexibility and the bending resistance while maintaining an electric characteristic provided by an existing shield member unlike a related-art metal layer formed of one type of metal, and has found that the metal layer can function as if the metal layer were an integrated metal layer of one layer from an electrical standpoint.

According to an embodiment, a flat cable includes: a cable body including a plurality of conductors arranged with a prescribed pitch therebetween; a ground layer disposed to the cable body; and a shield member disposed in such a manner as to cover a surface of the cable body. The shield member includes a metal member formed by placing a first conductive adhesive layer between a plurality of metal layers, and allows one of the metal layers among the metal layers of outer most layers to be conductively connected with the ground layer.

According to the flat cable of the embodiment, the metal member forming the shield member includes the metal layer and the first conductive adhesive layer made of a pliable material, so that the first conductive adhesive layer and the metal layer are electrically connected through conductive particles included in the first conductive adhesive layer. That is, according to the flat cable of the embodiment, the metal layer is formed in such a manner as to function as if the metal member were an integrated metal layer of one layer from an electrical standpoint.

According to the flat cable of the embodiment, therefore, in a case where the metal layer is formed in thin, electrical characteristics thereof can be maintained by the first conductive adhesive layer. In a case where the metal member as a whole increases a thickness thereof, the flat cable of the present invention can enhance flexibility and a bending resistance thereof by the first conductive adhesive layer made of the pliable material.

Moreover, the flat cable of the embodiment includes an air-containing layer, serving as an insulating member, having a width substantially the same as a transmission path width of the cable body. The air-containing layer is disposed in such a manner as to sandwich the cable body from both sides. The air-containing layer preferably includes a non-woven fabric cut in the width substantially the same as the transmission path width of the cable body. Herein, the shield layer covers a surface of the air-containing layer and is disposed in such a manner as to be conductively connected to the ground layer at terminal portions of both respective ends of the cable body.

The flat cable according to an embodiment employs the non-woven fabric serving as the air-containing layer functioning as the insulating member, so that that a thickness thereof can be reduced compared to a case of employing an insulating member made of resin, thereby providing the good flexibility and the good bending resistance. In the flat cable according to the embodiment, a width of the conductor and a thickness of the non-woven fabric can be changed to optionally adjust a dielectric constant, so that the characteristic impedance can be controlled.

The present embodiments provide a flat cable having good flexibility and a good bending resistance by an existing manufacturing process using an inexpensive material without deteriorating a good electrical characteristic provided by a strip structure.

Additional features and advantages are described herein, and will be apparent from, the following Detailed Description and the figures.

DETAILED DESCRIPTION

Hereinafter, an embodiment will be described in detail with reference to the drawings.

According to the embodiment, a flexible flat cable (FFC) serves as an interconnecting cable for various components disposed inside various electronic devices. Particularly, the flexible flat cable includes one metal layer formed in a pseudo manner using a conductive adhesive agent, thereby having an electrical characteristic substantially the same as that of a flat cable using a related-art metal foil shield while maintaining good flexibility and a good bending resistance thereof.

The metal layer is hereafter referred to as a word representing both a metal foil and a vapor-deposited metal layer.

Figure 1:
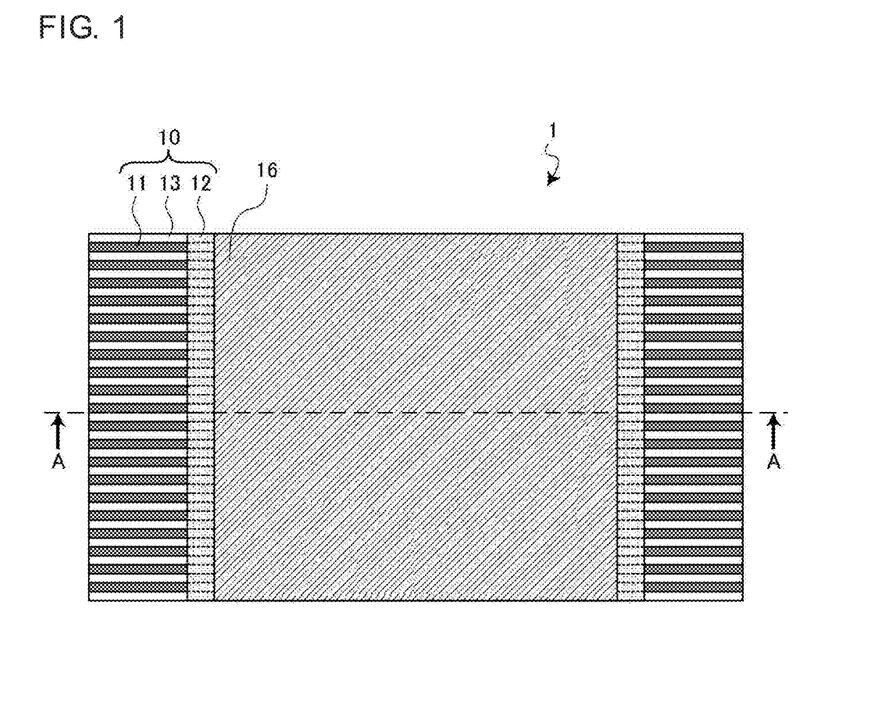
FIG. 1 is a schematic plan view illustrating a flexible flat cable according to an embodiment.
Figure 2:
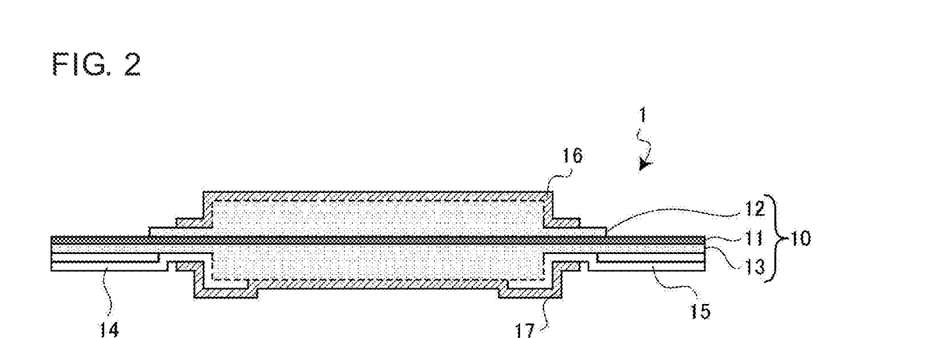
FIG. 2 is a cross-sectional view illustrating the flexible flat cable taken along line A-A of FIG. 1 according to the embodiment.

Referring to FIG. 1 and FIG. 2, a flexible flat cable 1 according to the embodiment is illustrated in a schematic plan view and a cross-sectional view, respectively. FIG. 2 illustrates the flexible flat cable 1 taken along a line A-A of FIG. 1. The flexible flat cable 1 includes a cable body 10 as illustrated in FIG. 1. The cable body 10 is formed by sandwiching a plurality of conductors 11 from both sides by a first insulating member 12 and a second insulating member 13 and undergoing lamination in a state that the conductors 11 are arranged in parallel with a prescribed pitch therebetween. Herein, each of the first and second insulating members 12 and 13 includes a prescribed adhesive layer provided thereto. That is, the cable body 10 is structured as a cable of a strip structure. Each of the conductors 11, for example, can be made of soft copper plated with tin on a surface thereof. Each of the first insulating member 12 and the second insulating 13, for example, can be formed by laminating a prescribed insulating adhesive layer on a low dielectric member made of polyethylene terephthalate having holes. The insulating adhesive layer can be made of, for example, epoxy resin, acrylic resin, melamine resin, polyamide resin, and polyimide resin serving as binder resin. Particularly, the insulating adhesive layer is preferably made of the epoxy resin or acrylic resin serving as the binder resin from an adhesive strength standpoint or an availability standpoint.

Figure 3:
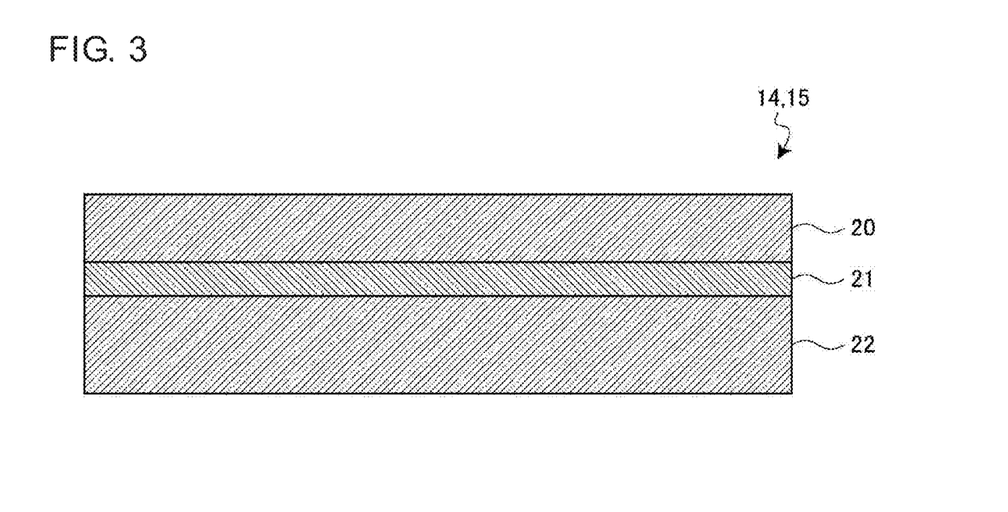
FIG. 3 is a cross-sectional view illustrating a first ground foil and a second ground foil disposed in the flexible flat cable according to the embodiment.

Moreover, the flexible flat cable 1 includes a first ground foil 14 and a second ground foil 15, each of which forming a ground layer, disposed to respective terminal portions provided on both ends of the cable body 10. For example, each of the first ground foil 14 and the second ground foil 15 is formed by laminating a metal layer 20 and an acrylic adhesive layer 21 as illustrated in FIG. 3, and is provided in a state that a release sheet 22 is adhered to a bottom layer of the acrylic adhesive layer 21. The metal layer 20 can be made of any metal having good conductivity such as gold, silver, copper, and lead. Particularly, the metal layer 20 is preferably made of the copper or aluminum from an electrical characteristic standpoint or an availability standpoint. The acrylic adhesive layer 21 can be made of acrylate, for example, monofunctional acrylate and polyfunctional acrylate such as bifunctional acrylate, and trifunctional acrylate. The acrylic adhesive layer 21 can be made of one of such acrylate or by mixing two or more such acrylates. Each of the first ground foil 14 and the second ground foil 15 is adhered to the second insulating member 13.

Figure 4:
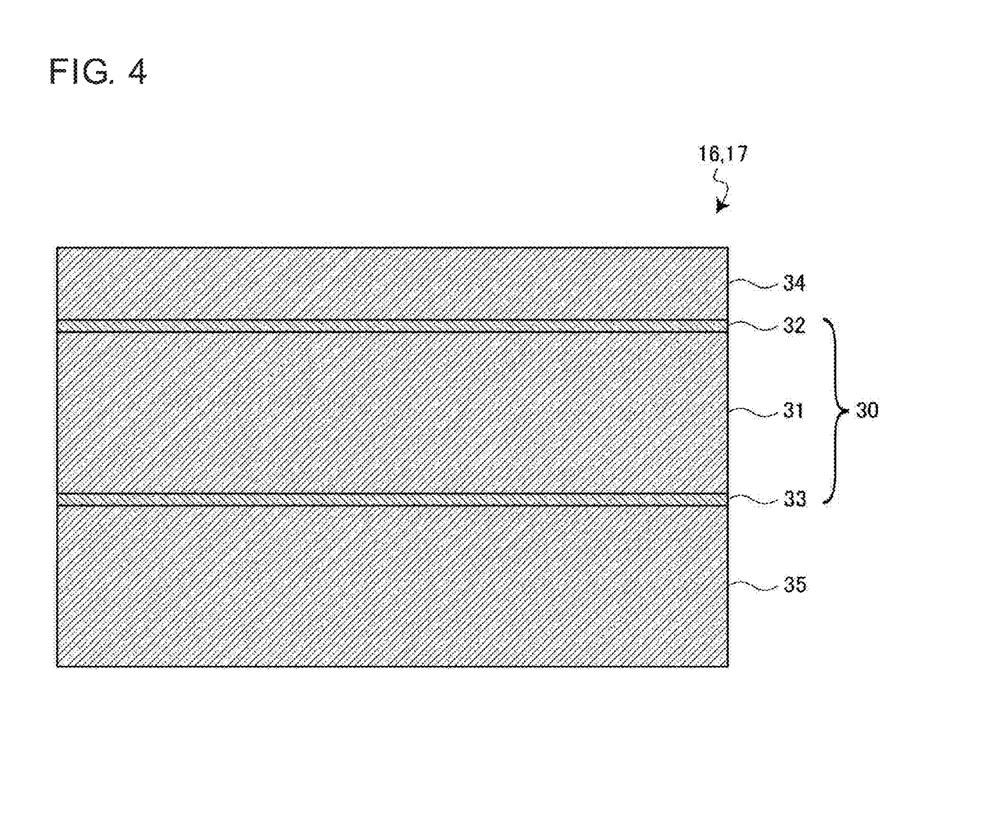
FIG. 4 is a cross-sectional view illustrating a first shield member and a second shield member disposed in the flexible flat cable according to the embodiment.

Moreover, the flexible flat cable 1 includes a first shield member 16 and a second shield member 17 deposed in such a manner as to cover the first insulating member 12 and the second insulating member 13. For example, each of the first shield member 16 and the second shield members 17 is formed by laminating a metal member 30 and a polyethylene terephthalate film 34 serving as a base film, and providing a conductive adhesive layer 35 on a surface opposite to the polyethylene terephthalate film 34 as illustrated in FIG. 4. Herein, the metal member 30 includes metal layers 32 and 33 formed on respective surfaces (that is, both surfaces) of a conductive adhesive layer 31. Each of the first shield member 16 and the second shield member 17 includes the metal layers 32 and 33 one of which is adhered in such a manner as to be conductively connected to the first ground foil 14 and the second ground foil 15 through the conductive adhesive layer 35. Therefore, each of the first shield member 16 and the second shield member 17 also functions as a ground. The conductive adhesive layers 31 and 35 can be made of, for example, epoxy resin, acrylic resin, melamine resin, polyamide resin, and polyimide resin serving as binder resin. Particularly, the epoxy resin or acrylic resin serving as the binder resin is preferred from the adhesive strength standpoint or the availability standpoint.

In such a flexible flat cable 1, the metal layers 32 and 33 formed on respective surfaces (that is, both surfaces) of the conductive adhesive layer 31 are employed as the metal member 30. In other words, each of the first shield member 16 and the second shield member 17 includes the metal member 30 formed by placing the conductive adhesive layer 31 between the metal layers 32 and 33 of two layers.

Herein, the conductive adhesive layer 31, for example, includes an anisotropic conductive adhesive film (also referred to as an anisotropic conductive film or ACF) or an anisotropic conductive adhesive paste (also referred to as an anisotropic conductive paste or ACP). Each of these anisotropic conductive adhesive agents is made of a material including fine conductive particles dispersed in the binder resin. Each of these anisotropic conductive adhesive agents includes an adhesive function with an electrical connection function in a thickness direction through the conductive particles by application of the pressure and the heat, and also includes an insulation function in the thickness direction and a vertical direction. The conductive adhesive layer 31 preferably has a thickness of 10 μm to 50 μm from an electrical characteristic standpoint.

Each of the metal layers 32 and 33 is, for example, formed as: a metal foil, such as copper, adhered to the both surfaces of the conductive adhesive layer 31; a vapor-deposited metal layer, such as silver, provided on the both surfaces of the conductive adhesive layer 31 by vapor deposition; or a metal plated layer provided by plating metal on the both surfaces of the conductive adhesive layer 31. Each of the metal layers 32 and 33 can include any metal having good conductivity such as gold, silver, copper, and lead. Particularly, the silver is preferred from an electrical characteristic standpoint or an availability standpoint. The metal foil is most preferred for each of the metal layers 32 and 33 among the metal foil, the vapor-deposited layer, and the metal plated layer, for example, from the electrical characteristic standpoint or a corrosion resistance standpoint. Moreover, each of the metal layers 32 and 33 preferably has a thickness of 0.05 μm to 0.5 μm from the electrical characteristic standpoint.

The metal member 30 formed of the conductive adhesive layer 31 and the metal layers 32 and 33 is provided by electrically connecting the conductive adhesive layer 31 and the metal layers 32 and 33 through the conductive particles included in the conductive adhesive layer 31. That is, the flexible flat cable 1 includes the metal member 30 formed in such a manner as to function as if the metal layer were an integrated metal layer of one layer from the electrical standpoint.

Since the metal member 30 is used to form the first shield member 16 and the second shield member 17, the flexible flat cable 1 includes the metal layer having a thickness thicker than that of a related-art shield member, in which a vapor-deposited metal layer is only used as a shield layer, in an amount of the thickness of the conductive adhesive layer 31, thereby improving the permeation characteristic thereof. Moreover, the metal member includes a portion formed of the conductive adhesive layer 31 made of a pliable material including the resin and the conductive particles, so that the flexible flat cable 1 can provide the good flexibility and the good bending resistance even in a case where the metal member 30 increases the thickness thereof.

That is, the flexible flat cable 1 can control the characteristic impedance, and can provide the good flexibility and the good bending resistance without deteriorating the electrical characteristics such as the permeation loss, the eye pattern opening ratio, and the electromagnetic interference (EMI) provided by the strip structure. Since the metal member 30 includes the conductive adhesive layer 31, the flexible flat cable 1 can be produced at low costs, thereby improving cost effectiveness. Moreover, the flexible flat cable 1 can be produced by heat lamination as similar to an existing production process, and can be produced by the existing production process using an inexpensive material. Therefore, the flexible flat cable can be produced by the existing facilities at low costs. In addition, since the flexible flat cable 1 can be produced by the heat lamination, an elongation thereof can be easy, thereby providing a high yield rate.

Therefore, the flexible flat cable 1 is suitable for the various electronic devices in need of high-speed signal transmission. The electronic devices, for example, include a notebook personal computer and a flat-screen television set in which high definition image transmission is demanded.

The above embodiment has described using the metal member including the metal layers formed on the both respective surfaces of the conductive adhesive layer. The embodiments, however, can allow the conductive adhesive layers and the metal layers to be interlaminated to form the metal member including the conductive adhesive layers placed between the plurality of metal layers, and can allow the first ground foil and the second ground foil to be conductively connected with one of the metal layers among the metal layers of outermost layers. However, a structure having two metal layers, that is, substantially similar to the above metal member 30, is most preferred from the electrical characteristic standpoint in consideration of an object allowing the metal layers to electrically function as the metal member of one layer.

Moreover, the above embodiment has described using a substance, formed by laminating the prescribed insulating adhesive layer on the low dielectric member made of polyethylene terephthalate having the holes, serving as the first insulating member and the second insulating member. An embodiment, however, can allow an air-containing layer to be provided on the transmission path and the dielectric member, so that the dielectric constant can be optionally adjusted, thereby controlling the characteristic impedance. A description is now given of a specific example of such a flexible flat cable of the embodiment with reference to FIGS. 5 and 6.

Figure 5:
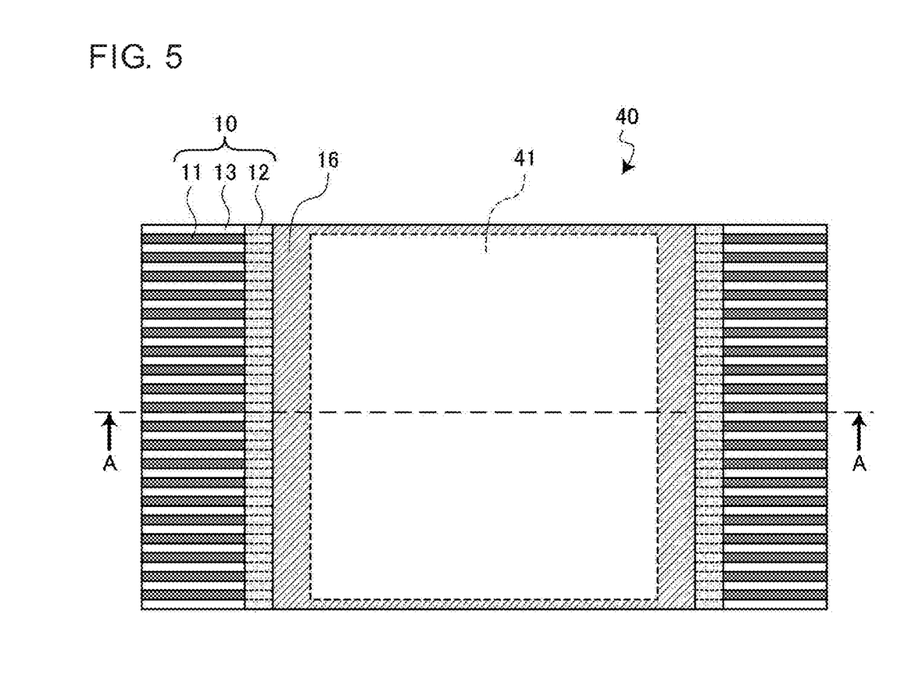
FIG. 5 is a schematic plan view illustrating another flexible flat cable according to the embodiment.
Figure 6:
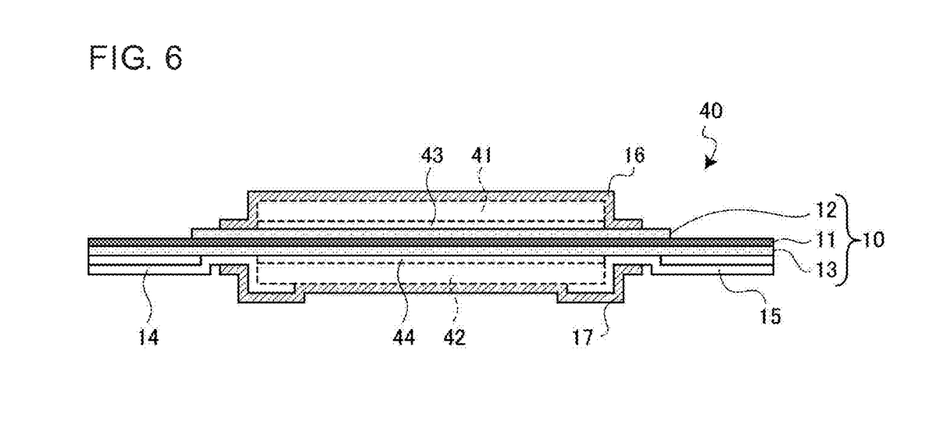
FIG. 6 is a cross-sectional view illustrating the flexible flat cable taken along line A-A of FIG. 5 according to the embodiment.

A flexible flat cable 40 includes a cable body 10 including both sides thereof being sandwiched by a first non-woven fabric 41 and a second non-woven fabric 42, respectively. Herein, each of the first non-woven fabric 41 and the second non-woven fabric 42 serves as an air-containing layer having a width substantially the same as that of a transmission path of the cable body 10. The first non-woven fabric 41 and the second non-woven fabric 42 are cut in the width substantially the same as that of the transmission path of the cable body 10 and are provided in a state that the first non-woven fabric 41 and the second non-woven fabric 42 are respectively adhered to prescribed double-sided adhesive layers 43 and 44 such as a double-sided tape. Each of the first non-woven fabric 41 and the second non-woven fabric 42 is adhered to the cable body 10 through the double-sided adhesive layers 43 and 44, thereby functioning as an insulating member. Each of the first non-woven fabric 41 and the second non-woven fabric 42 can include a fibrous material, for example, made of cellulose, polyester, aramid, and polyimide containing a flame resistance agent therein. Particularly, the cellulose type or an aromatic aramid type containing the flame resistance agent is preferred from a heat resistance standpoint or a flame resistance standpoint.

Each of the first ground foil 14 and the second ground foil 15 is adhered to the second non-woven fabric 42. Each of a first shield member 16 and a second shield member 17 according to the present invention is disposed in such a manner as to cover each of the surfaces of the first non-woven fabric 41 and the second non-woven fabric 42.

Since the flexible flat cable 40 includes the first non-woven fabric 41 and the second non-woven fabric 42 each of which serving as the insulating member, the flexible flat cable 40 can have a thinner thickness compared to the flexible flat cable 1 described above, thereby providing better flexibility compared to the flexible flat cable 1.

The flexible flat cable 40 includes the first non-woven fabric 41 and the second non-woven fabric 42 instead of an insulating member made of resin, thereby significantly enhancing a resistance against stress to be applied during the bending thereof.

Moreover, the flexible flat cable 40 can optionally adjust the dielectric constant by changing a width and a thickness of a conductor 11 and a thickness of each of the first non-woven fabric 41 and the non-woven fabric 42, thereby controlling the characteristic impedance. Accordingly, the flexible flat cable 40 reduces the likelihood of deteriorating the good electrical characteristic provided by the strip structure.

In addition, the flexible flat cable 40 can include a substance or substances having the flame resistance in a practical manner and the good heat resistance to serve as the first non-woven fabric 41 and the second non-woven fabric 42, thereby capable of dealing with the fire caused by an increase in a heating value or a calorific value due to a high density circuit of an electronic device on which the flexbile flat cable to be mounted.

The flexible flat cable 40 can be produced by heat lamination as similar to an existing production process. In a case where an insulating member made of resin is employed in a cable as similar to a conventional manner, the cable may be difficult to be produced by the heat lamination due to a property of the resin made insulating member. Accordingly, the cable needs to be pressed with heat (heat-press). Since the heat-press is performed as a singulation or batch process, productivity or production cost is affected, causing not following a market demand. The flexible flat cable 40, on the other hand, can be produced by the heat lamination, thereby enhancing productivity and reducing the production cost.

EXAMPLES

Hereinafter, a particular example of a flexible flat cable according to an embodiment will be described based on an experimental result.

Figure 7:
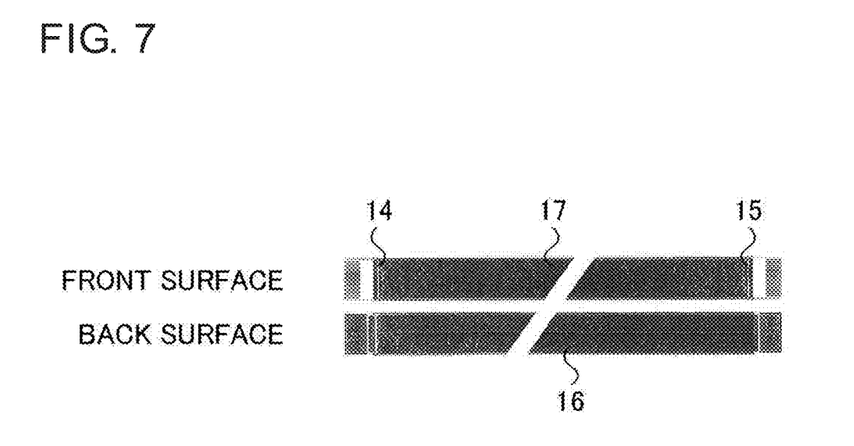
FIG. 7 is a plan view illustrating a flexible flat cable produced as an example.

A flexible flat cable as illustrated in FIG. 7 was produced with specifications as illustrated in Tables 1 and 2. Such materials illustrated in Tables 1 and 2 were used to serve as the conductor 11, the first insulating member 12, the second insulating member 13, the first ground foil 14, the second ground foil 15, the first shield member 16, and the second shield member 17 described above.

TABLE 1

| MATERIAL | SPECIFICATION |
| --- | --- |
| CONDUCTOR | TIN-PLATED SOFT COPPER |
| | WIDTH OF 0.25 mm × THICKNESS OF 0.040 mm |
| INSULATOR | F2100 AVAILABLE FROM SONY CHEMICAL & |
| | INFORMATION DEVICE CORP. |
| | POLYETHYLENE TEREPHTHALATE/ |
| | INSULATING ADHESIVE LAYER = THICKNESS OF 23 μm/ |
| | THICKNESS OF 41 μm |
| GROUND FOIL | AL7080 AVAILABLE FROM SONY CHEMICAL & |
| | INFORMATION DEVICE CORP. |
| | ALUMINUM LAYER/ |
| | ACRYLIC ADHESIVE LAYER = THICKNESS OF 30 μm/ |
| | THICKNESS OF 10 μm |
| SHIELD MEMBER | POLYETHYLENE TEREPHTHALATE/SILVER LAYER/ |
| | CONDUCTIVE ADHESIVE LAYER/SILVER LAYER/ |
| | CONDUCTIVE ADHESIVE LAYER = THICKNESS OF 9 μm/ |
| | THICKNESS OF 0.1 μm/THICKNESS OF 20 μm/ |
| | THICKNESS OF 0.1 μm/THICKNESS OF 20 μm |
| CONDUCTOR PITCH | 0.5 mm |
| NUMBER OF PINS | 21-PIN |
| CABLE LENGTH | 1000 mm |

Particularly, the flexible flat cable included the conductors 11 which were arranged in parallel with 0.5 mm pitch therebetween. Each of the conductors 11 was made of soft copper including a surface thereof plated with tin, and had a width of 0.25 mm and a thickness of 0.040 mm (0.25 mm×0.040 mm). Each of the first insulating member 12 and the second insulating member 13 was formed of an insulating member "F2100" (available from Sony Chemical & Information Device Corporation) having a total thickness of 64 μm including an insulating adhesive layer having a thickness of 41 μm laminated on a low dielectric material made of polyethylene terephthalate having holes each of which had a thickness of 23 μm. Each of the first ground foil 14 and the second ground foil 15 was formed of a ground foil "AL7080" (available from Sony Chemical & Information Device Corporation) having a total thickness of 40 μm including a metal layer 20 made of aluminum having a thickness of 30 μm and the acrylic adhesive layer 21 having a thickness of 10 μm as described above with reference to FIG. 3. Each of the first shield member 16 and the second member 17 was formed of a shield member having a total thickness of 49.2 μm. Herein, the shield member having the total thickness of 49.2 μm was formed by laminating a metal member 30, including metal layers 32 and 33 having a vapor-deposited silver layer having a thickness 0.1 μm provided on respective surfaces (both surfaces) of a conductive adhesive layer 31 having a thickness of 20 μm, and a polyethylene terephthalate film 25 having a thickness of 9 μm as described above with reference to FIG. 4. The materials with such specifications were used to produce the flexible flat cable having 21 pins and a cable length of 1000 mm.

In addition to the flexible flat cable serving as the example, the inventors of the present invention produced flexible flat cables serving as comparative examples using shield members substantially the same as the one that has currently been on the market instead of the first shield member and the second shield member having the specifications as illustrated in TABLE 1.

The flexible flat cable produced as a first comparative example included a metal foil serving as a shield layer and shield members serving as the first shield member and the second shield member. Each of the shield members had a total thickness of 32 μm including a conductive adhesive layer having a thickness of 20 μm on a copper foil having a thickness of 12 μm as illustrated in TABLE 2. The flexible flat cable produced as a second comparative example included a vapor-deposited metal layer serving as a shield layer and a shield member having a total thickness of 29.1 μm including a vapor-deposited silver shield member having a vapor-deposited silver layer having a thickness of 0.1 μm on a polyethylene terephthalate film having a thickness of 9 μm as illustrated in TABLE 3.

TABLE 2

| MATERIAL | SPECIFICATION |
| --- | --- |
| CONDUCTOR | TIN-PLATED SOFT COPPER |
| | WIDTH OF 0.25 mm × THICKNESS OF 0.040 mm |
| INSULATOR | F2100 AVAILABLE FROM SONY CHEMICAL & |
| | INFORMATION DEVICE CORP. |
| | POLYETHYLENE TEREPHTHALATE/ |
| | INSULATING ADHESIVE LAYER = THICKNESS OF 23 μm/ |
| | THICKNESS OF 41 μm |
| GROUND FOIL | AL7080 AVAILABLE FROM SONY CHEMICAL & |
| | INFORMATION DEVICE CORP. |
| | ALUMINUM LAYER/ |
| | ACRYLIC ADHESIVE LAYER = THICKNESS OF 30 μm/ |
| | THICKNESS OF 10 μm |

TABLE 2-continued

| MATERIAL | SPECIFICATION |
| --- | --- |
| SHIELD MEMBER | COPPER FOIL/<br>CONDUCTIVE ADHESIVE LAYER = THICKNESS OF 12 μm<br>THICKNESS OF 20 μm |
| CONDUCTOR PITCH | 0.5 mm |
| NUMBER OF PINS | 21-PIN |
| CABLE LENGTH | 1000 mm |

TABLE 3

| MATERIAL | SPECIFICATION |
| --- | --- |
| CONDUCTOR | TIN-PLATED SOFT COPPER<br>WIDTH OF 0.25 mm × THICKNESS OF 0.040 mm |
| INSULATOR | F2100 AVAILABLE FROM SONY CHEMICAL &<br>INFORMATION DEVICE CORP.<br>POLYETHYLENE TEREPHTHALATE/<br>INSULATING ADHESIVE LAYER = THICKNESS OF 23 μm/<br>THICKNESS OF 41 μm |
| GROUND FOIL | AL7080 AVAILABLE FROM SONY CHEMICAL &<br>INFORMATION DEVICE CORP.<br>ALUMINUM LAYER/<br>ACRYLIC ADHESIVE LAYER = THICKNESS OF 30 μm/<br>THICKNESS OF 10 μm |
| SHIELD MEMBER | POLYETHYLENE TEREPHTHALATE/<br>SILVER LAYER/CONDUCTIVE ADHESIVE LAYER =<br>THICKNESS OF 9 μm/THICKNESS OF 0.1 μm/<br>THICKNESS OF 20 μm |
| CONDUCTOR PITCH | 0.5 mm |
| NUMBER OF PINS | 21-PIN |
| CABLE LENGTH | 1000 mm |

The flexible flat cable produced as the example was used to measure differential impedance thereof using a time domain reflectometry (TDR) method. Herein, the TDR method represents a method for measuring an electromagnetic wave in a high frequency band between 1 MHz and 30 GHz and displaying the wave on a time axis. The differential impedance to be targeted was 100Ω+/−10%. The measurement result is shown in FIG. 8.

Figure 9:
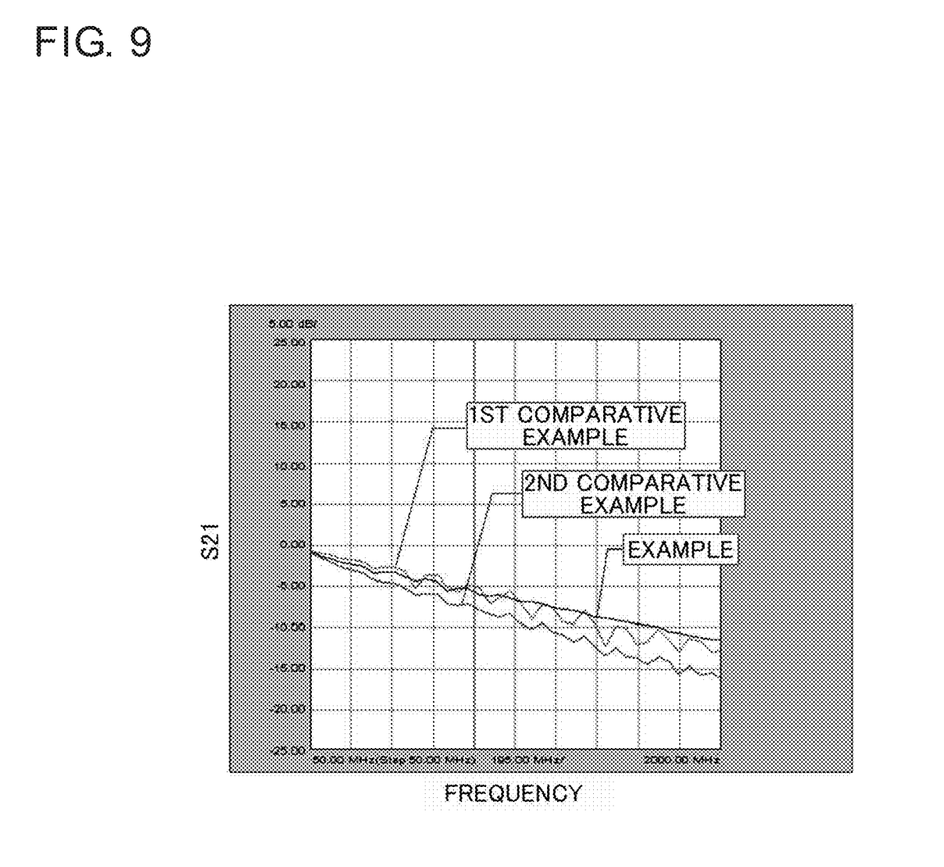
FIG. 9 is a schematic diagram illustrating measurement results of permeation characteristics (S21) of the flexible flat cable of FIG. 7 and a flexible flat cable produced as a comparative example.
Figure 10:
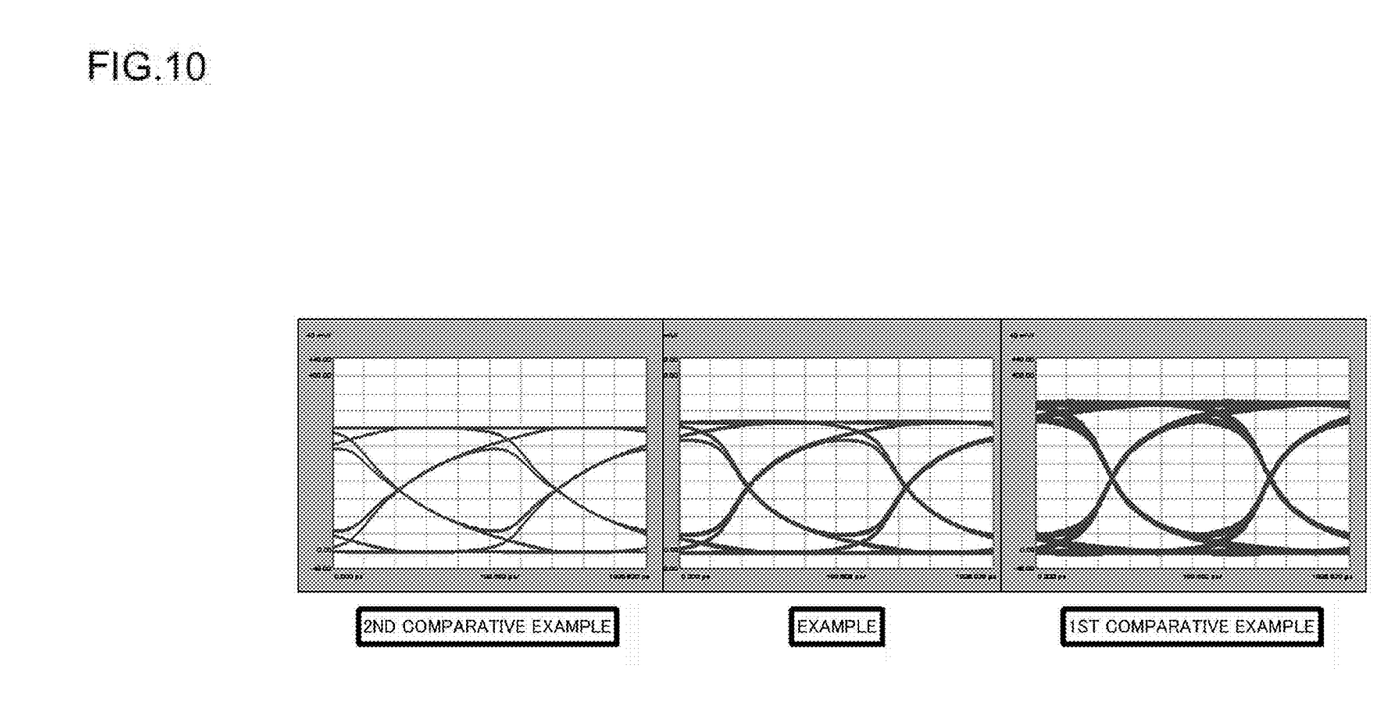
FIG. 10 is a schematic diagram illustrating measurement results of eye patterns of the flexible flat cable of FIG. 7 and the flexible flat cable produced as the comparative example.

The flexible flat cable produced as the example and the flexible flat cables produced as the comparative examples were used to measure the permeation characteristics (S21) and an eye pattern thereof. The eye pattern was measured where a start-up time Tr is 100 ps and a data rate is 1 Gbps. The measurement result of the permeation characteristics is illustrated in FIG. 9 while the measurement result of the eye pattern is illustrated in FIG. 10.

Figure 8:
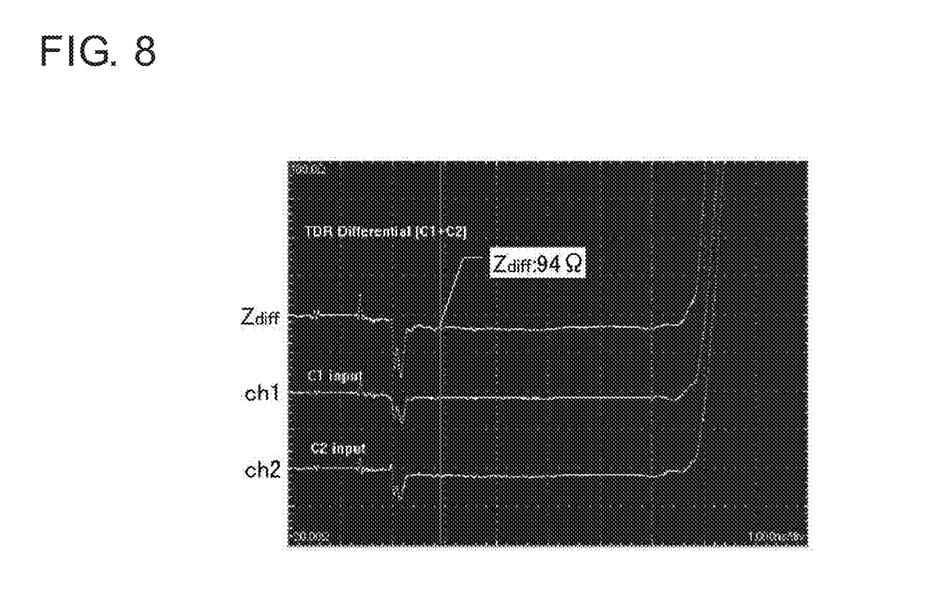
FIG. 8 is a schematic diagram illustrating a measurement result of differential impedance of the flexible flat of FIG. 7.

As illustrated in FIG. 8, a differential impedance $Z_{diff}$ was 94Ω where two systems of signal channel 1 and signal channel 2 were input with respect to the flexible flat cable produced as the example. Accordingly, the target differential impedance of 100Ω+/−10% was satisfied. The flexible flat cable produced as the example had the permeation characteristic (S21) of −10 dB/m where the signal was 1 GHz, and the permeation characteristic (S21) thereof was substantially equal to that of the flexible flat cables produced as the comparative examples as illustrated in FIG. 9. Herein, the permeation characteristic (S21) has a value of −10 dB/m that is identical to a target value of the permeation characteristic (S21) in high definition multimedia interface (HDMI). Moreover, good openings were provided with respect to the eye patterns as illustrated in FIG. 10, and the electrical characteristics were not deteriorated.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A flat cable comprising:
   a cable body including a plurality of conductors arranged with a prescribed pitch therebetween;
   a ground layer disposed to the cable body; and
   a shield member disposed in such a manner as to cover a surface of the cable body,
   wherein the shield member includes a metal member formed by placing a first conductive adhesive layer between a plurality of metal layers, and enables one of the metal layers to be conductively connected with the ground layer, and
   wherein the first conductive adhesive layer is made of a pliable material and each of the metal layers has a thickness of 0.05 μm to 0.5 μm.

2. The flat cable according claim 1, wherein the metal member is formed by placing the first conductive adhesive layer between two of the plurality of metal layers.

3. The flat cable according to claim 1, wherein the shield member enables one of the metal layers to be conductively connected to the ground layer through a second conductive adhesive layer.

4. The flat cable according to claim 1, wherein the first conductive adhesive layer has a thickness ranging from 10 μm to 50 μm.

5. The flat cable according to claim 1, wherein the first conductive adhesive layer is an anisotropic conductive adhesive agent.

6. The flat cable according to claim 1, wherein the metal layer is formed as any of a metal foil, a vapor-deposited metal layer, and a metal plated layer.

7. The flat cable according to claim 1, wherein the metal layer includes silver.

8. The flat cable according to claim 1, wherein the shield member includes a protection base material laminated on one of surfaces of the metal member.

9. The flat cable according to claim 8, wherein the protection base material is polyethylene terephthalate.

10. The flat cable according to claim 1, further comprising an air-containing layer, serving as an insulating member, having a width substantially the same as a transmission path width of the cable body, the air-containing layer being disposed in such a manner as to sandwich the cable body from both sides, wherein the air-containing layer includes a non-woven fabric cut in a width substantially the same as the transmission path width of the cable body, and wherein the shield member covers a surface of the air-containing layer and is disposed in such a manner as to be conductively connected with the ground layer at terminal portions of respective both ends of the cable body.

11. The flat cable according to claim 10, wherein the non-woven fabric has a flame resistance.

* * * * *